United States Patent
Greenberg

(10) Patent No.: US 7,292,114 B2
(45) Date of Patent: Nov. 6, 2007

(54) LOW-NOISE HIGH-STABILITY CRYSTAL OSCILLATOR

(75) Inventor: Jody Greenberg, Sunnyvale, CA (US)

(73) Assignee: Marvell World Trade Ltd. (BB)

( * ) Notice: Subject to any disclaimer, the term of this patent is extended or adjusted under 35 U.S.C. 154(b) by 59 days.

(21) Appl. No.: 11/242,621

(22) Filed: Oct. 3, 2005

(65) Prior Publication Data

US 2007/0024385 A1    Feb. 1, 2007

Related U.S. Application Data

(60) Provisional application No. 60/722,734, filed on Sep. 30, 2005, provisional application No. 60/704,525, filed on Aug. 1, 2005.

(51) Int. Cl.
*H03B 5/32* (2006.01)

(52) U.S. Cl. ................. 331/158; 331/116 FE; 331/116 R; 331/74; 331/175

(58) Field of Classification Search ............ 331/116 R, 331/158, 116 FE, 74, 175
See application file for complete search history.

(56) References Cited

U.S. PATENT DOCUMENTS

| | | | |
|---|---|---|---|
| 4,091,339 A | 5/1978 | Sugimoto et al. | |
| 6,590,460 B1 | 7/2003 | Tenten et al. | |
| 6,798,301 B1 | 9/2004 | Balan et al. | |
| 6,819,196 B2* | 11/2004 | Lovelace et al. | 331/183 |
| 7,061,338 B2* | 6/2006 | Arigliano | 331/109 |
| 2003/0001685 A1 | 1/2003 | Groe et al. | |

FOREIGN PATENT DOCUMENTS

EP     0140343 A2    5/1985
WO    WO 2005/008881 A1    1/2005

OTHER PUBLICATIONS

Eric A. Vittoz, Marc R. Degrauwe and Serge Bitz, High Performance Crystal Oscillator Circuits: Theory and Application, Journal of Solid-State Circuits, Jun. 1988, pp. 774-783, vol. 23.

* cited by examiner

*Primary Examiner*—Arnold Kinkead

(57) ABSTRACT

Circuits, methods, and apparatus that provide low-noise, high-stability crystal oscillators having controlled-amplitude differential output signals and DC level control. A crystal oscillator circuit has two feedback loops, one for setting the DC level of its signals, the other for adjusting the amplitude of those signals. The DC level feedback loop can set the DC component of the oscillator signals to a voltage midway between two supply voltages. The amplitude control loop sets the amplitude of the output of the crystal oscillator signal to be within a range. The amplitude can be set to provide a maximum swing without clipping the supply voltages in order to provide high-stability and minimal jitter. The amplitude control circuit can also be digital for improved noise performance. The time constants of these two loops can be separated such that instabilities are avoided.

34 Claims, 11 Drawing Sheets

LOW-NOISE HIGH-STABILITY CRYSTAL OSCILLATOR

This application claims the benefit of U.S. provisional application Nos. 60/704,525 filed Aug. 1, 2005 and 60/722,734 filed Sep. 30, 2005, which are incorporated by reference.

BACKGROUND

The present invention relates generally to crystal oscillators, and more specifically to low-noise, high-stability crystal oscillators.

Crystal oscillators are extremely useful circuits. They provide clocks and periodic signal sources for telecommunications, wired and wireless networks, and myriad other electronic applications. For example, crystal oscillators are commonly used to time data transfers between integrated circuits. In these applications, crystal oscillator phase noise and jitter degrades performance, causes data transmission errors, and limits data throughput. Thus, it is desirable to provide crystal oscillators having low-noise and high-stability.

The signal-to-noise ratio for a crystal oscillator can be improved by increasing its signal strength. One way to increase signal strength or amplitude is to generate a differential signal, as opposed to a single-ended signal. A differential signal not only provides a signal that is nominally twice the amplitude of a single-ended signal, but provides a level of common-mode rejection as well, which further reduces noise. Also, a buffer receiving these larger oscillator signals can operate at a lower gain resulting in less noise.

Unfortunately, excessively large crystal oscillator signals can cause jitter or instability in the oscillator circuit. As these signals become excessive, they may become limited by one or both of a pair of supply voltages for the crystal oscillator. Specifically, electrostatic discharge (ESD) diodes to these supplies can begin to conduct current. This clips the oscillator signals, which adds harmonics and spurious frequency components to the otherwise single-tone signal. These harmonics pull or shift the oscillator operating frequency, resulting in center frequency inaccuracies.

Also, signals from crystal oscillators typically need to be AC coupled to an integrated circuit that is using the oscillator. If the DC level of the crystal oscillator signals could be well controlled, it would be possible to design an input buffer that could directly connect to the crystal without using the AC coupling capacitors. This would reduce component count, save board space, and reduce costs. This would also help prevent the oscillator signals from being clipped by the ESD diodes.

Thus, what is needed are circuits, methods, and apparatus that provide crystal oscillators having large, amplitude-controlled differential signal outputs and mechanisms for controlling their DC levels.

SUMMARY

Accordingly, embodiments of the present invention provide circuits, methods, and apparatus that provide low-noise, high-stability crystal oscillators having large differential output signals and DC level controls. One exemplary embodiment of the present invention provides a crystal oscillator having two feedback loops, one for setting the DC levels of its signals, the other for adjusting the amplitude of those signals. Various embodiments of the present invention may incorporate either one or both of these loops, as well as one or more of the features described herein.

A specific embodiment of the present invention provides a feedback loop arranged to control the DC level of a crystal oscillator's signals. The DC level can be set to a voltage midway between two supply voltages, to a reference voltage, or to any other appropriate voltage. For example, the voltage may be a ground-referenced voltage that is equal to one-half the minimum supply voltage for the oscillator circuit. This voltage may be a function of either power supply or other condition such as temperature. Alternately, this voltage may be independent of these parameters.

This embodiment further provides an amplitude-control feedback loop. This loop sets the amplitude of the output of the crystal oscillator signal to be within a range. The amplitude can be set to give a maximum swing without clipping either supply voltage in order to provide high-stability and minimal jitter. The amplitude control circuit can also be digital for improved noise performance. If this control loop is digital, a startup circuit can be included. In a specific embodiment, the startup circuit is an analog control loop that is disabled in favor of a digital control loop once the crystal oscillator circuit starts.

The time constants or bandwidths of these two loops can be separated such that instabilities are avoided. Specifically, interaction between the loops is minimized by setting the bandwidth of the amplitude control loop to be much lower than the bandwidth of the DC level control loop.

An exemplary embodiment of the present invention provides an integrated circuit. This integrated circuit includes a means for driving a resonant element to generate the first oscillator signal, means for adjusting a DC level of the first oscillator signal, and means for adjusting an amplitude of the first oscillator signal.

This or other embodiments may further provide means for driving the resonant element by providing a drive signal to the resonant element, wherein the drive signal is responsive to the resonant element. This or other embodiments may further provide means for providing the drive signal with a gain circuit. This or other embodiments may further provide for the gain circuit being a MOS transistor. This or other embodiments may further provide means for adjusting the DC level of the first oscillator signal by comparing the first oscillator signal with a bias voltage, and providing an output responsive to the comparison. This or other embodiments may further provide for the gain element being a MOS transistor responsive to the output of the amplifier. This or other embodiments may further provide means for adjusting the DC level of the first oscillation signal to be between two supply voltages received by the integrated circuit. This or other embodiments may further provide means for measuring an amplitude of the first oscillation signal, and means for providing a measurement of the amplitude of the first oscillation signal. This or other embodiments may further provide means for measuring the amplitude of the first oscillation signal using a peak detector. This or other embodiments may further provide for the amplitude of the first oscillation signal being measured using a diode and a capacitance. This or other embodiments may further provide means for comparing the measurement of the amplitude of the first oscillation signal with a high threshold and a low threshold, and means for providing one or more signals in response to the comparison. This or other embodiments may further provide means for decrementing an output value when the amplitude of the first oscillation signal is greater than the high threshold, means for maintaining the output value when the amplitude of the first oscillation signal is less than the high threshold and greater than the low threshold, and means for incrementing the output value when the amplitude of the first oscillation signal is less than the low threshold. This or other embodiments may further provide means for generating a bias current in response to the output value. This or other embodiments may further provide means for providing the bias current to a gain circuit, the gain circuit providing the drive to the resonant element. This or other embodiments may further provide means for setting the DC level of the second oscillation signal using the DC level of the first oscillation signal. This or other embodiments may further provide means for DC coupling the DC level of the first oscillation signal to generate the DC level of the second oscillation signal.

Embodiments of the present invention may be implemented in code, for example, code to be used in a digital signal processor or compiled using VHDL. One such exemplary embodiment of the present invention provides code of an oscillator including code for a gain element configured to drive a resonant element, code for a DC control loop configured to adjust a DC level of a signal at an output of the gain element, and code for an amplitude control loop configured to adjust an amplitude of the signal at the output of the gain element.

This or other embodiments may further provide code for a gain element having an input responsive to a first node of the crystal and a crystal having a second node responsive to the output of the gain element. This or other embodiments may further provide code for the gain element being a transistor. This or other embodiments may further provide code for the transistor being a MOS transistor. This or other embodiments may further provide code for the DC control loop comprising an amplifier configured to compare the signal at the output of the gain element to a bias voltage and provide an output responsive to the comparison. This or other embodiments may further provide code for the gain element being a MOS transistor responsive to the output of the amplifier. This or other embodiments may further provide code for the DC level of the signal at the output of the gain element adjusting to a voltage that is between two supply voltages received by the integrated circuit. This or other embodiments may further provide code for the amplitude control loop comprising an amplitude measurement circuit configured to provide a measurement of an amplitude of the signal at the output of the gain element. This or other embodiments may further provide code for the amplitude measurement circuit comprising a peak detect circuit. This or other embodiments may further provide code for the peak detect circuit comprising a diode and a capacitance. This or other embodiments may further provide code for the amplitude control loop further comprising a comparator configured to compare the measurement of the amplitude of the signal at the output of the gain element with a high threshold and a low threshold, and further configured to provide one or more signals in response to the comparisons. This or other embodiments may further provide code for the amplitude control loop further comprising a counter configured to increment, decrement, or maintain an output value in response to the one or more signals provided the comparator. This or other embodiments may further provide code for the amplitude control loop further comprising a digital-to-analog converter configured to convert the output of the counter to a current. This or other embodiments may further provide code for the current being provided to the gain element. This or other embodiments may further provide code for the DC level of a signal at an output of the gain element being used to set a DC level of a signal at an input of the gain element. This or other embodiments may further provide code for the DC level of the signal at the output of the gain element being DC coupled to the input of gain element using a resistor.

A better understanding of the nature and advantages of the present invention may be gained with reference to the following detailed description and the accompanying drawings.

DESCRIPTION OF EXEMPLARY EMBODIMENTS

Figure 1:
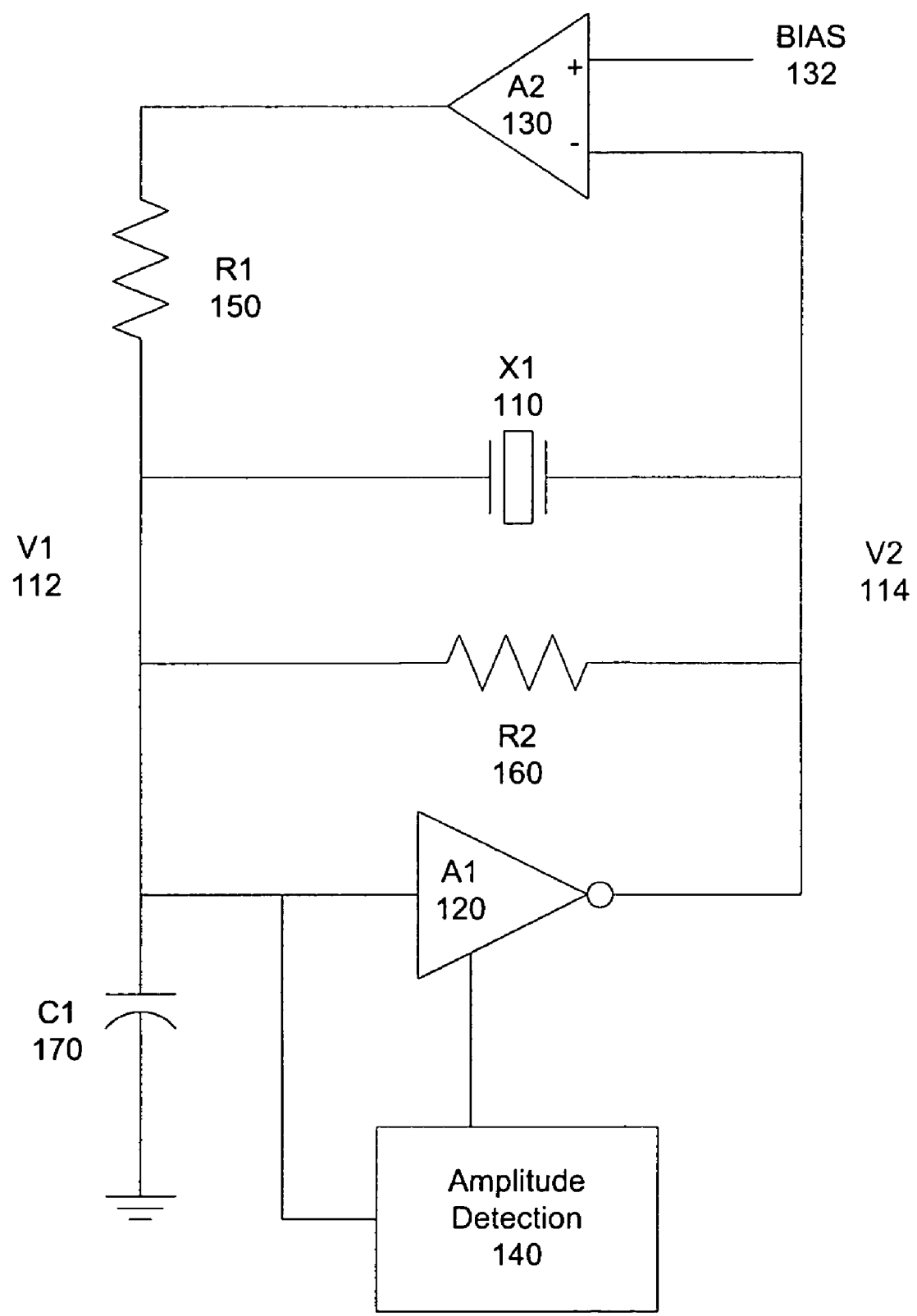
FIG. 1 is a block diagram of a low-noise, high-stability crystal oscillator according to an embodiment of the present invention.

FIG. 1 is a block diagram of a low-noise, high-stability crystal oscillator according to an embodiment of the present invention. This figure includes a crystal X1 110, gain circuit A1 120, amplifier A2 130, amplitude detection circuit 140, resistors R1 150 and R2 160, and capacitor C1 170. This figure, as with the other included figures, is shown for illustrative purposes and does not limit either the possible embodiments of the present invention or the claims.

The crystal X1 110 is driven by the gain element A1 120. In this and other embodiments of the present invention, the crystal X1 110 may be a crystal or other resonant element or circuit, for example, it may be an L-C tank circuit. The gain element A1 120 provides a net inversion and may be as simple as a transistor, though it may alternately be one or more inverters or buffers in series, so long as the combination provides a net signal inversion. The gain element A1 120 provides the gain necessary to drive crystal X1 110.

In operation, the signal V2 on line 114, the output terminal of the gain device A1 120, oscillates above and below a DC voltage. This DC voltage is the DC component of the signal V2 on line 114; the oscillation is the AC signal component. Resistor R1 120 equalizes the DC component of the signal V1 on line 112 with the DC component of the signal V2 on line 114. The two signals, V1 on line 112 and V2 on line 114, are nominally phase shifted by 180 degrees and each are ideally sinusoidal in nature.

The DC voltage component of V2 on line 114 is compared to a bias voltage on line 132 by the amplifier A2 130. In various embodiments, other voltages can be compared to the bias voltage on line 132. For example, the DC component of the signal V1 on line 112 can be compared. In other embodiments, the resistor R1 120 is a number of resistors in series, and a voltage at a node between two of these resistors can be compared to the bias voltage on line 132. In a specific embodiment of the present invention, the bias voltage on line 132 is set to a ground-referenced voltage that is equal to one-half a minimum supply voltage for the oscillator. In other embodiments of the present invention, this bias voltage may be equal to a reference voltage. For example, the bias voltage on line 132 may be equal to a bandgap voltage. In other embodiments of the present invention, the bias voltage may be a function of VCC, temperature, or other condition; alternately, the bias voltage on line 132 may be independent of one or more of these parameters.

The amplifier A2 130 receives the signal V2 on line 114. The amplifier compares the DC component of the signal V2 on line 114 to the bias voltage received on line 132. This comparison generates a signal at the output of the amplifier A2 130. This voltage is then used to set the DC voltage for the signal V1 on line 112.

The DC control feedback loop operates as follows. As the DC component of the signal V2 on line 114 increases, the voltage at the output of the amplifier A2 130 decreases. This lowers the DC component of the signal V1 on line 112. Since the signal V2 on line 114 is DC coupled to V1 on line 112, V2 on line 114 is similarly reduced, thus compensating for the original increase.

The amplitude detection circuit 140 receives the signal V1 on line 112, and provides a bias current or voltage to the gain circuit A1 120. The amplitude detection circuit 140 compares the oscillation amplitude of the signal V1 on line 112 to one or more thresholds. As the amplitude of the signal V1 on line 112 increases, the amplitude detection circuit 140 decreases the gain of gain circuit A1 120, thus reducing the drive to the crystal X1 110. This in turn lowers the amplitude of the voltage swing of the signal V2 on line 114. Conversely, as the amplitude of the signal V1 on line 112 decreases, the amplitude detection circuit 140 increases the gain of gain circuit A1 120, which increases the amplitude of V2 on line 114. In this way, feedback is provided such that the amplitude of the signal V2 on line 114 is maintained at a certain level (or within a range of levels, depending on the exact implementation.)

Again, the gain circuit A1 120 can be as simple as a single transistor in some embodiments of the present invention. When it is a transistor, such as a MOS transistor, this oscillator can be referred to as a Pierce oscillator. In this configuration, the crystal X1 110 oscillates in the parallel resonance mode. Other types of oscillators may also be improved by embodiments of the present invention. These include Pierce, Colpitts, Hartley, Armstrong, Clapp, and other types of oscillators. An example of a Pierce oscillator is shown in the next figure.

Figure 2:
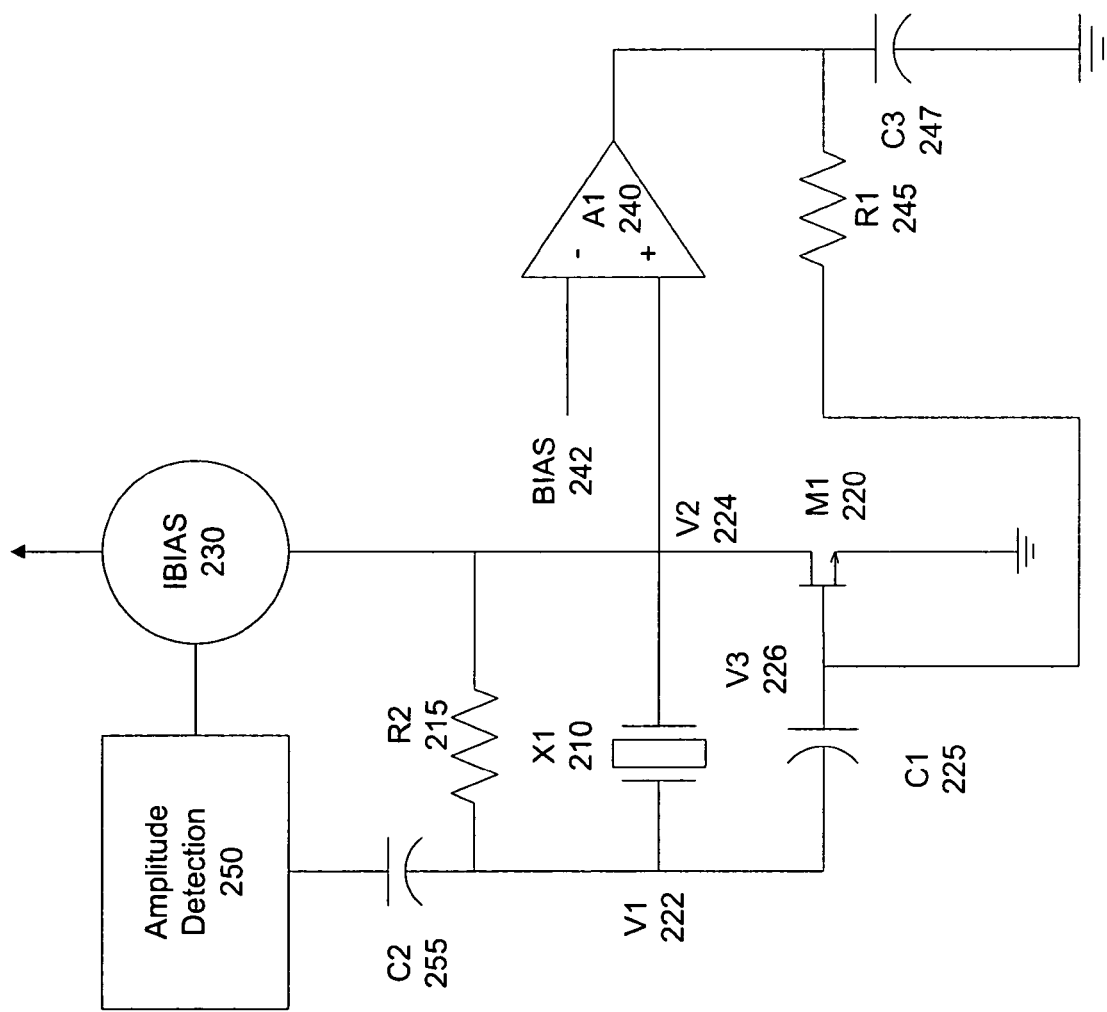
FIG. 2 is a block diagram of a low-noise, high-stability Pierce crystal oscillator according to an embodiment of the present invention.

FIG. 2 is a block diagram of a low-noise, high-stability Pierce crystal oscillator according to an embodiment of the present invention. This figure includes a crystal X1 210, transistor M1 220, bias current source 230, amplifier A1 240, amplitude detection circuit 250, resistors R1 245 and R2 215, and capacitors C1 225, C2 255, and C3 247.

In this configuration, transistor M1 220 provides the gain necessary to drive crystal X1 210. The crystal X11 210 is AC coupled through capacitor C1 225 to the base of M1 220. This separates the DC level of the crystal oscillator signal V1 on line 222 from the bias voltage at the gate of transistor M1 220. As before, resistor R2 215 is a large value resistor that biases the DC voltage of the signal V1 on line 222 such that it equals the DC voltage of the signal V2 on line 224. Since the resistor R2 215 is a large resistor, care should be taken to avoid leakage currents, for example through capacitor C1 225, or other capacitors that have been omitted for clarity.

The DC component of the signal V2 on line 224 is compared to the bias voltage on line 242 by the amplifier 240. Again, other voltages can be compared to the bias voltage on line 242. For example, the resistor R2 215 can be two or more resistors in series, with a voltage at a node between two of these resistors compared to the bias voltage on line 242. The amplifier 240 provides a voltage output across C3 247 that is coupled to the gate of transistor M1 220 by resistor R1 245. In a specific embodiment, the amplifier A1 240 is a transconductance or gm amplifier that provides a current which generates a voltage across capacitor C3 247. This output voltage sets the operating point for M1 220, which in turn sets the DC component of the signal V2 on line 224. Resistor R1 254 and capacitor C3 247 provide reverse isolation for the output of the amplifier A1 240 from the large AC swings on the gate of transistor M1 220.

More specifically, when the DC component of the signal V2 on line 224 is higher than the level of the bias signal on line 242, the output voltage of the amplifier A1 240 is reduced. This reduces the gate-to-source voltage of M1 220, which increases the DC voltage of the signal V2 on line 224.

The signal V1 on line 222 is AC coupled through capacitor C2 255 to the amplitude detection circuit 250. The amplitude detection circuit adjusts the bias current provided by the current source IBIAS 230. As the amplitude of the signal V1 on line 222 increases, the current provided by the bias current source 230 is decreased, thereby reducing the amplitude of the signals V2 on line 224 and V1 on line 222. Conversely, as the amplitude of the signal V1 on line 222 decreases, the current provided by the bias current source 230 is increased, thereby increasing the amplitude of the signals V2 on line 224 and V1 on line 222.

There are various ways in which the DC components of the oscillator voltage signals can be set or controlled. The feedback loops used to accomplish this may be analog, digital, or a combination thereof. One analog circuit that may be used is shown in the next figure. The subsequent figure shows a method of setting these DC components; the method may be implemented in an analog or digital manner.

Figure 3:
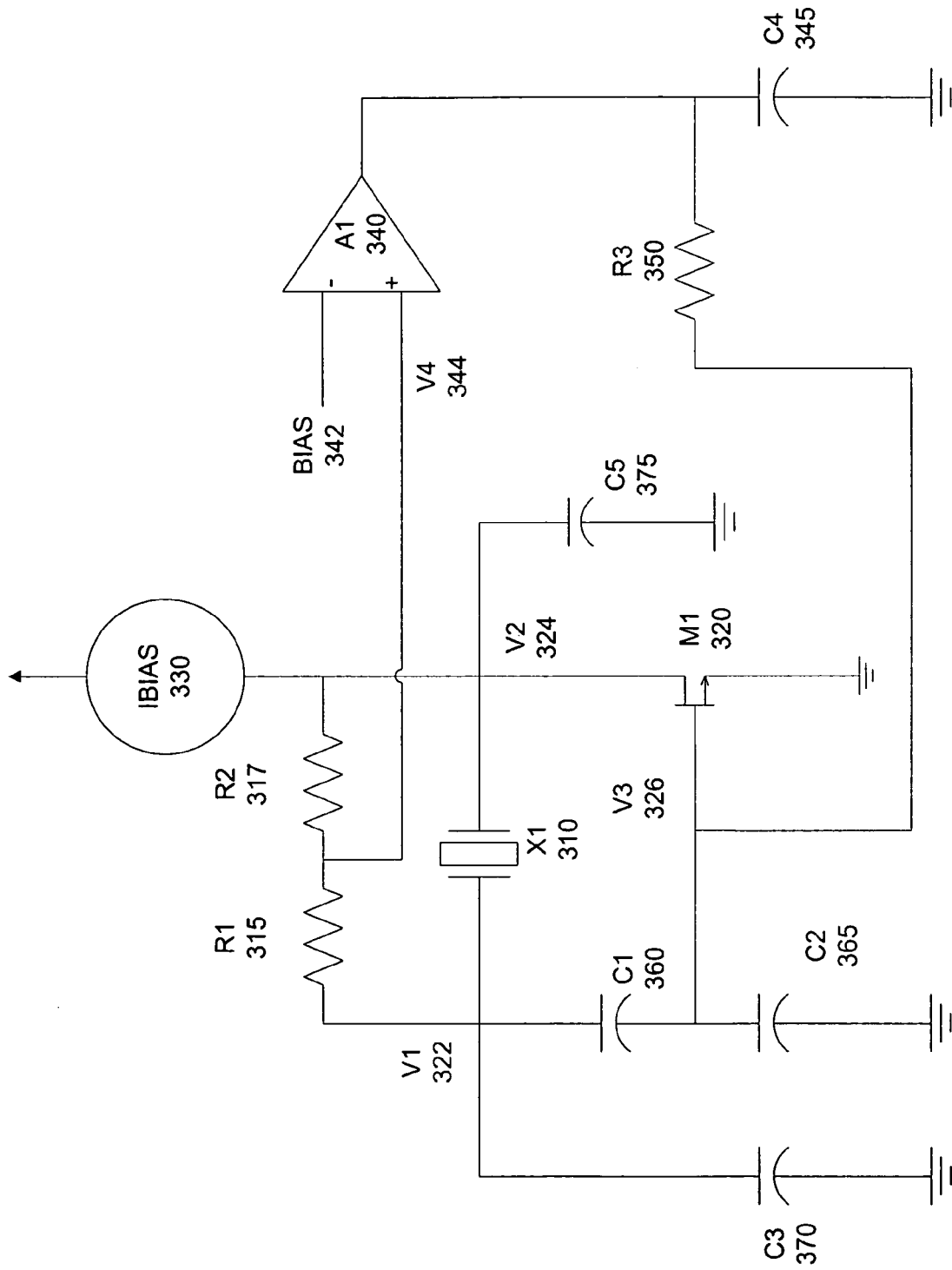
FIG. 3 is a schematic of a DC biasing loop for a crystal oscillator according to an embodiment of the present invention.

FIG. 3 is a schematic of a DC biasing loop for a crystal oscillator according to an embodiment of the present invention. This figure includes a crystal X1 310, transistor M1 320, current source IBIAS 330, amplifier A1 340, resistors R1 315, R2 317, and R3 350, and capacitors C1 360, C2 365, C3 370, C4 345, and C5 375. An amplitude detection circuit may be used to adjust the current provided by the current source IBIAS 330, but has been omitted for clarity.

The crystal X1 310 is driven by transistor M1 320. The crystal signal on line V1 322 is AC coupled to the gate of M1 320 by capacitor C1 360. A series combination of resistors R1 315 and R2 317 are used to set the DC levels of the signals V1 on line 322 and V2 on line 324 such that they are equal to the DC level of the signal V4 on line 344. Capacitors C3 370 and C5 375 are used to pull or tune the crystal's frequency. In various embodiments, these capacitors can include arrays of switchable capacitors allowing the crystal's frequency to be tuned or modulated, for example as part of an FM modulator.

Again, transistor M1 320 provides the drive current for the crystal X1 310. As the gate voltage of the transistor M1 320 increases, the drain current of the device increases rapidly. Accordingly, the DC bias voltage of M1 320 is typically near ground, that it is biased below the threshold of the transistor M1 320, such that the transistor M1 320 is typically off, turning on to provide a pulse of current to the crystal X1 310 once every oscillation cycle.

It is desirable for the signal V1 on line 322 to have a large amplitude. However, if this large signal were AC coupled directly to the gate of transistor M1 320, the gate of transistor M1 320 would require a DC bias below ground, otherwise it would provide excess drive current to the crystal 310. However, the amplifier A1 340 is not capable of driving below ground. One alternative is to provide a negative supply voltage for the amplifier A1 340, for example with a charge pump. This solution provides excellent noise performance. Alternately, the signal V1 on line 322 can be reduced in amplitude.

Accordingly, in this specific example, capacitor C2 365 is connected from the gate of M1 322 to ground. In this way, capacitors C1 316 and C2 365 form a capacitive divider that reduces the amplitude of the signal seen at the gate of M1 320. This allows the gate of transistor M1 320 to have a DC bias above ground. In a specific embodiment, the DC bias for the gate of M1 320 is approximately 200 mV, which can be supplied by the amplifier A1 340 without requiring a negative supply voltage.

The DC component of the signal V4 on line 344 is set by a feedback loop including amplifier A1 340, resistor R3 350, and transistor M1 320. Specifically, the voltage signal V4 on line 344 is compared to the bias signal received on line 342 by the amplifier A1 340. The signals V2 on line 324 and V1 on line 322 are each large oscillating signals that are 180 degrees out of phase. Accordingly, if the resistors R1 315 and R2 317 are equal, the signal V4 on line 344 has approximately the same DC level as the signals V1 on line 322 and V2 on line 324, but with little or no AC component. Thus, the signal V4 on line 344 provides a good voltage for comparison to the bias voltage on line 342 by the amplifier A1 340.

The amplifier A1 340 provides a voltage output across capacitor C4 345. The capacitor C4 345 can be used to limit the bandwidth, time constant, or frequency response of this loop. In a specific embodiment, the amplifier A1 340 provides a current output that is converted to a voltage by the capacitor C4 345. The output voltage of the amplifier A1 340 sets the DC bias voltage for transistor M1 320. The gate-to-source voltage of transistor M1 320 determines the operating point for the transistor, including its drain voltage, the signal V2 on line 324.

Figure 4:
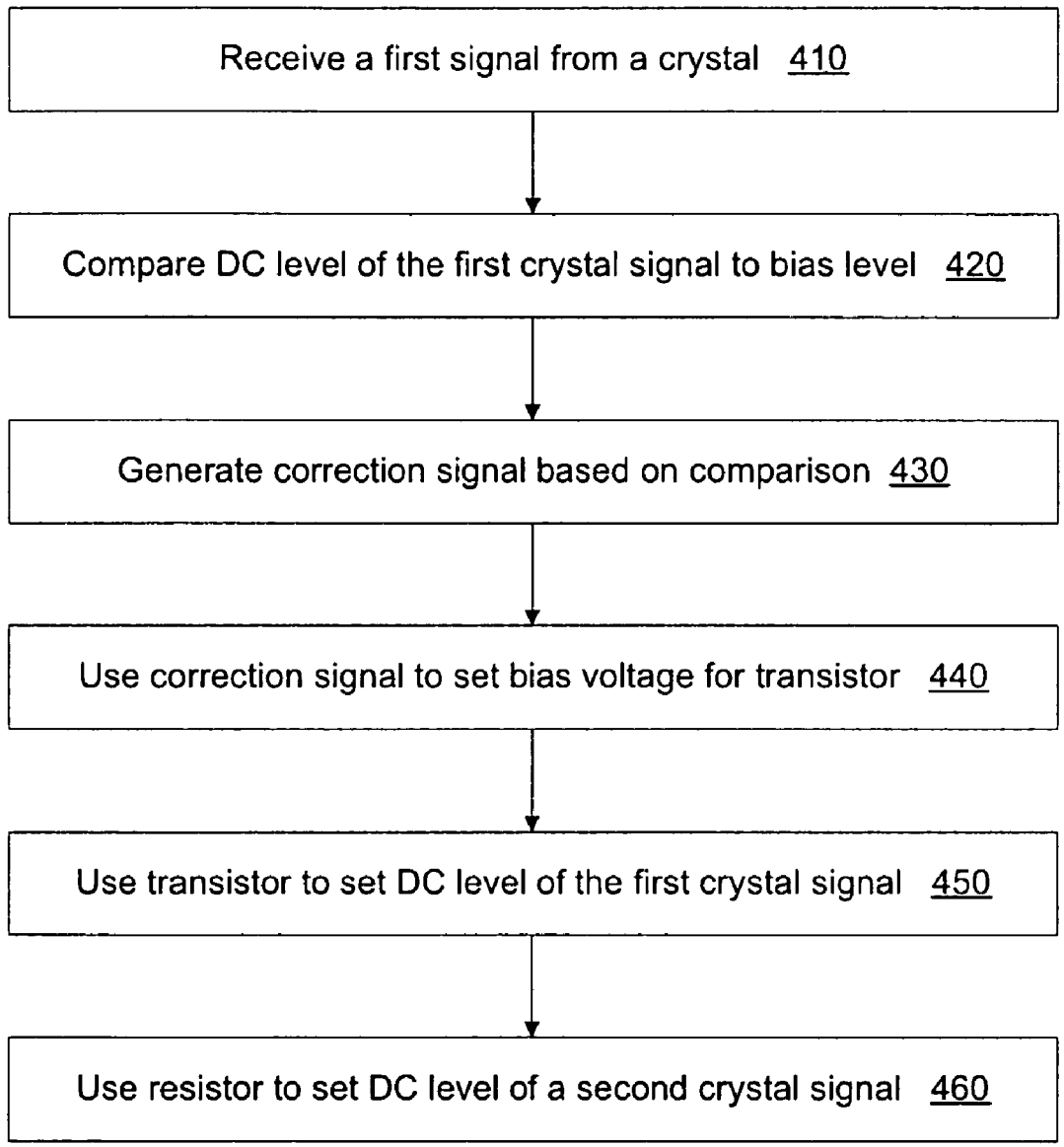
FIG. 4 is a flowchart showing the operation of the DC biasing loop, such as the DC biasing loop of FIG. 3.

FIG. 4 is a flowchart showing the operation of the DC biasing loop, such as the DC biasing loop of FIG. 3. According to this method, a signal from an oscillator is compared to a bias voltage. The comparison is used to set a bias condition for a transistor. The transistor then sets the DC level of the oscillator signal.

Specifically, in act 410, a first signal is received from a crystal. The DC level or component of the crystal signal is compared to a bias level in act 420. Again, this bias level may be set to be between two supply voltages, to a bandgap or other bias voltage, and it may be designed to track or be independent of supplies, temperature, processing, or other condition. For example, it may be set to a ground-referenced voltage that is approximately one-half a minimum supply voltage for the oscillator signal. Alternately, this bias level may be designed to be independent of one or more of these parameters.

A correction signal based on the comparison is generated in act 430. This correction signal is then used to set the DC level of the first crystal signal. There are many ways that this may be done, and they may depend on the particular circuit topology that is used. For example, the comparison may be done digitally, where the first crystal signal is filtered, digitized, and compared to a second digital value. In other embodiments of the present invention, the loop is analog.

In this specific example, the correction signal is used to set a bias voltage for a transistor in act 440. In act 450, the transistor is used to set a DC level for the first crystal signal. A resistor is used to set a DC level of a second crystal signal in act 460. Additionally, other resistors can be used to set other crystal signals.

Embodiments of the present invention and can include an amplitude detection circuit. The amplitude detection circuit can set the drive level for a transistor or other circuit used to provide gain for a crystal in a crystal oscillator circuit. This loop can be analog, digital, or a combination thereof. Again, to avoid interaction with a DC control loop, the bandwidth of the amplitude detection circuit can set to be lower than the bandwidth of the DC control loop. In other embodiments, other arrangements can be made; for example, the bandwidth of the amplitude detection circuit can set to be higher than the bandwidth of the DC control loop. In one specific embodiment of the present invention, the amplitude detection circuit is predominantly digital, and the bandwidth of the loop is set by a frequency and at which a value of an accumulator or counter is clocked or updated. One specific circuit that can detect an amplitude and use this information to adjust the amplitude's level is shown in the next figure, while one specific methodology of detecting an amplitude is shown in the subsequent figure.

Figure 5:
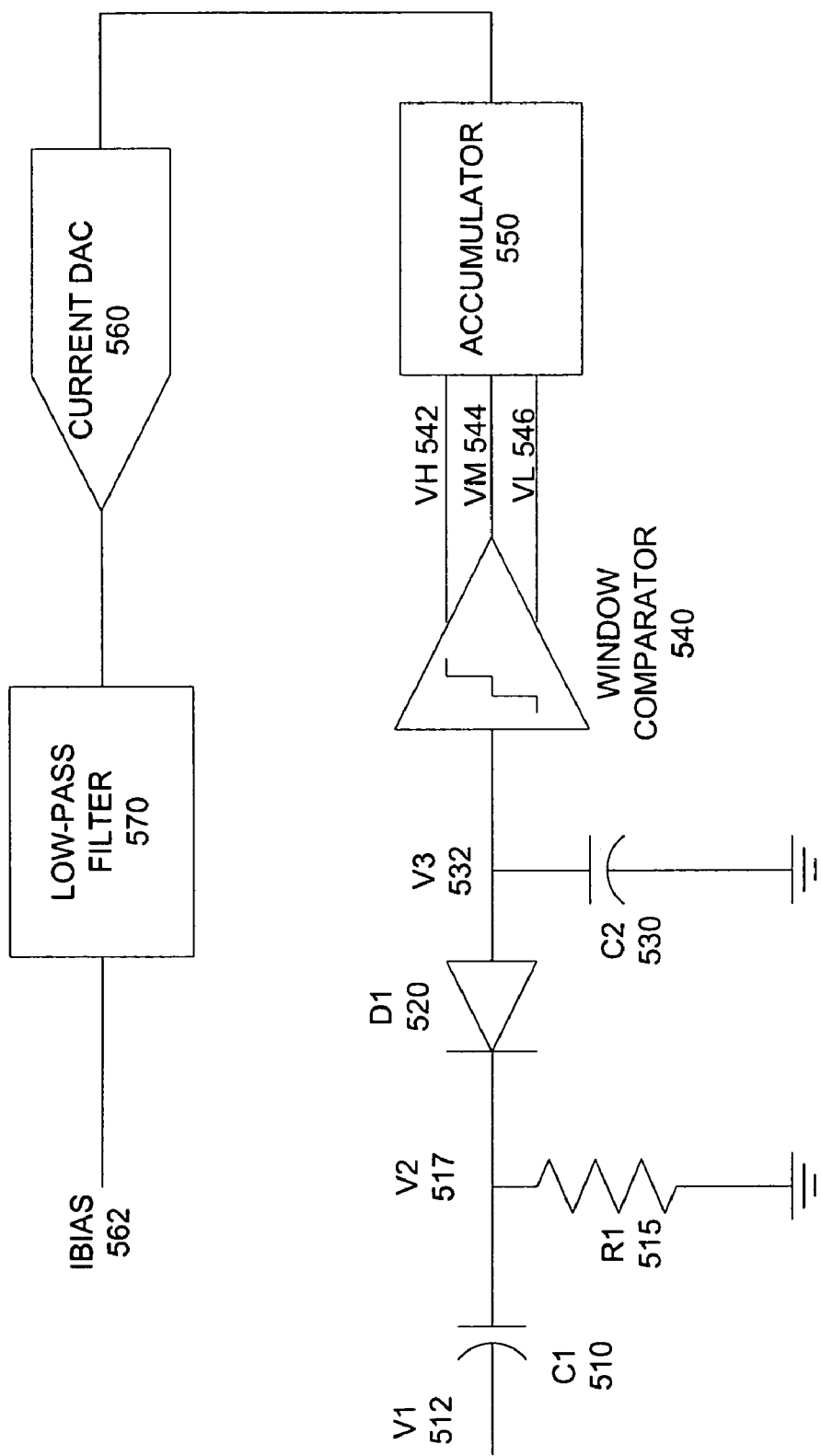
FIG. 5 is a schematic of a digital amplitude control loop for a crystal oscillator according to an embodiment of the present invention.

FIG. 5 is a schematic of a digital amplitude control loop for a crystal oscillator according to an embodiment of the present invention. The digital amplitude control loop includes an AC coupling capacitor C1 510, DC restoration resistor 515, a negative peak detector made up of a diode D1 520 and capacitor C2 530, window comparator 540, accumulator 550, current digital-to-analog converter (DAC) 560, and a low-pass filter 570. An oscillator signal is received on line V1 512 by the AC coupling capacitor C1 510. The current DAC 560 generates a bias current that is filtered by the low-pass filter and provided as current IBIAS on line 562. In a specific embodiment, the bias current on line 562 supplies current to a transistor, such as transistor M1 320 in FIG. 3.

Again, an oscillator signal V1 is received on line 512 and AC coupled as signal V2 on line 512 by AC coupling capacitor C1 510. The input signal V1 on line 512 may correspond to one of at least two signals, for example, V1 on line 322 or V2 on line 324 in FIG. 3. Detecting the amplitude of V1 on line 322 provides isolation between the amplitude detector input and IBIAS current output on line 562. The size of capacitor C1 510 should be large in comparison to the parasitic capacitances of diode D1 520 and resistor R1 515 in order to avoid signal losses that would be caused by the resulting capacitive divider. The resistor R1 515 sets the DC component of the signal V2 on line 515 to an appropriate bias voltage, BIAS on line 516 in this example. In an exemplary embodiment of the present invention, the resistor R1 515 may be connected to a bias line that is midway between two supplies such as VCC and ground. In various embodiments, R1 515 is connected to the same or similar bias line as the BIAS voltage on line 342 in FIG. 3.

The negative peak of the signal V2 on line 517 is detected by the diode D1 520 and capacitor C2 530 in order to generate a peak detected output signal V3 on line 532. In other embodiments, a positive peak detector can be used, for example, by reversing diode D1 520. In other embodiments, other peak detectors or envelope detectors can be used. As the voltage of the signal V2 on line 517 decreases, the voltage of the signal V3 on line 532 follows. As the signal V2 on line 517 reaches its minimum value or peak, the signal V3 on line 532 reaches a corresponding voltage, plus a diode drop caused by the diode D1 520. In various embodiments of the present invention, other peak detectors that compensate for, or do not include this diode drop, are used. As the level of the signal V2 on line 517 increases, the diode D1 520 reverse biases, and is effectively disconnected from the capacitor C2 530, which holds the negative peak voltage.

The window comparator 540 compares the signal V3 on line 532 to two thresholds, a high threshold and a low threshold. When the voltage of the signal V3 is lower than the low threshold, signal VL on line 546 is active. When the voltage of the signal V3 on line 532 is between the high threshold and the low threshold, the signal VM on line 544 is active. When the voltage of the signal V3 on line 532 is higher than the high threshold, the signal VH on line 542 is active. In various embodiments of the present invention, the signal VM on line 544 is not required. In various embodiments, the window comparator can be two comparators, one that compares the signal V3 on line 532 with a high threshold, and one that compares the signal V3 on line 532 with a low threshold.

The accumulator 550 can be an up/down counter that provides a digital word to the current DAC 560. When the signal VL on line 546 is active, the accumulator 550 counts down by one bit. When the signal VH on line 542 is active, the accumulator 550 counts up by one bit. When the signal VM on line 544 is active, the accumulator 550 does not change value. In other embodiments, the accumulator may count in a different manner, so long as the peak detector, accumulator 550, and DAC 560 operate together to properly control the amplitude of the oscillator signals.

The accumulator can be clocked by a signal that controls the rate at which the accumulator output can change state. The frequency of this clock signal controls the bandwidth of the amplitude detection circuit. In one specific embodiment of the present invention, in order to avoid interactions with a DC control loop, the bandwidth of this amplitude detection circuit is set to be lower than the bandwidth of the DC control loop. The accumulator can alternately be an analog-to-digital converter, such as a flash converter. Also, more complicated functions can be implemented. For example, transfer functions that include poles and zeros can be implemented to more specifically tailor the frequency response of the amplitude detection circuit. The locations of these poles and zeros can also be programmable or otherwise adjustable.

The current DAC 560 receives a digital word from the accumulator 550. The digital word can be binarily weighted or thermally decoded, or have some other weighting or combination thereof. The current DAC 560 is typically a number of switches each configured to turn a current source on or off. The resulting current can be filtered and provided to a gain element or transistor, such as transistor M1 320 in FIG. 3. The filtering is performed in this specific example by the low-pass filter 570. This filter removes the high frequency components of the current DAC output, protecting the oscillator gain element from these transients. The current sources may be configured to be independent of supply, temperature, or processing. In one embodiment of the present invention, as the digital word increases in value, the DAC provides more current to the gain device. In other embodiments, the DAC may provide less current as the digital word increases.

In other embodiments, the voltage of signal V3 on line 532 is compared to a single threshold. In this case, a single output indicating whether the voltage of signal V3 on line 532 is higher or lower than the threshold is provided. In this configuration, during operation, the comparison signal tends to alternate between one state and another, causing the accumulator to toggle between two levels, and resulting in the current DAC 560 switching between two bias current levels. This tends to add digital switching noise to the oscillator circuit. Using two thresholds provides a window in which the device may operate without changing the output of the accumulator 550 or the resulting bias current level provided by the current DAC 560.

Figure 6:
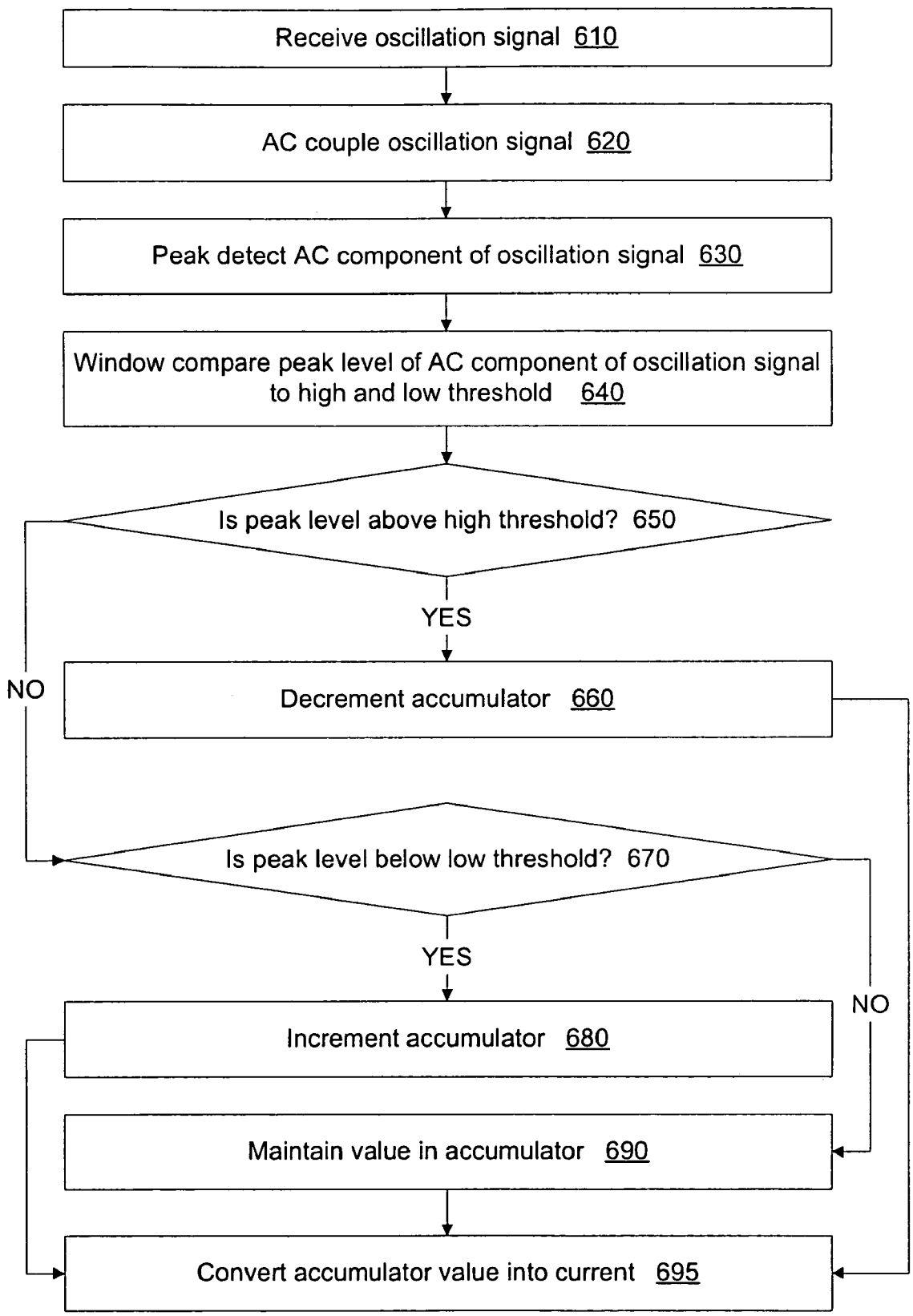
FIG. 6 is a flowchart showing the operation of an amplitude control loop, such as the amplitude control loop of FIG. 5.

FIG. 6 is a flowchart showing the operation of an amplitude control loop, such as the amplitude control loop of FIG. 5. In this embodiment of the present invention, an oscillation signal from a crystal is peak detected and compared to a high and a low threshold. The comparison results are used to control an accumulator, which in turn provides an output that is converted to a bias current, the bias current used to drive the gain device or circuit in the oscillator. The peak detection described here detects positive peaks, though negative peak detection can alternately be used.

Specifically, in act 610, an oscillation signal is received from a crystal. This signal is AC coupled, such that its DC component is removed in act 620. In act 630, the DC component of the oscillation signal is peak detected.

The peak detected level is then compared to a high and a low threshold in act 640. In act 650, it is determined whether the peak level is above a high threshold. If it is, the accumulator is decremented in act 660. If the peak level is not above a high threshold, it is determined whether the peak level is below the low threshold in act 670. If it is, the accumulator is incremented in act 680. If the peak detected value is lower than the high threshold, but higher than the low threshold, the value in the accumulator is maintained in act 690. Again, in various embodiments of the present invention, the accumulator may increment or decrement in different ways according to the exact implementation used.

The value of the accumulator is converted into a current in act 695. Again, this current can be used to drive a transistor or other circuit that is providing gain to the crystal that is generating the oscillation signal.

The amplitude detection circuits of the previous figures may have a stable state where the crystal does not oscillate or provide an output signal of sufficient amplitude to properly clock the accumulator 550 in FIG. 5. Although the presence of noise typically starts these oscillators, in order to provide a robust and fast start-up, an analog amplitude detection circuit can be used. Once the oscillator is running, the analog amplitude detection circuit can be disabled in favor of a digital amplitude detection circuit, such as the circuit shown in FIG. 5. One analog amplitude control circuit that may be used at start-up is shown in the following figure.

Figure 7:
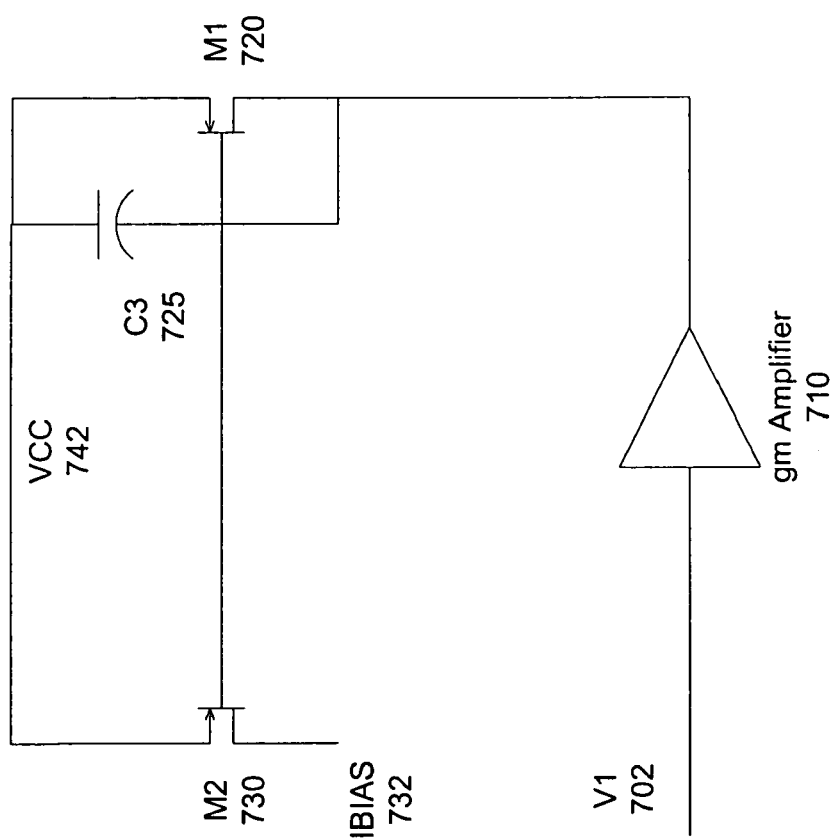
FIG. 7 is a schematic of an analog amplitude control loop used to start a crystal oscillator according to an embodiment of the present invention.

FIG. 7 is a schematic of an analog amplitude control circuit used to start a crystal oscillator according to an embodiment of the present invention. This figure includes gm amplifier 710 and a p-channel current mirror including transistors M1 720 and M2 730, and decoupling capacitor C3 725.

An input signal V1 is received on line 702 by the gm amplifier 710. The gm amplifier 710 provides a current output that is mirrored by the p-channel current mirror transistors M1 720 and M2 730. Transistor M2 730 can be connected in parallel with the current DAC in the digital amplitude detector circuit. In a specific embodiment, the signal V1 on line 702 is the negative peak detected signal V3 on line 532 in FIG. 5, though in other embodiments, it can be a different signal. As the amplitude of the crystal oscillator signals increase, the voltage V1 on line 702 decreases, thus decreasing the current provided by the gm amplifier 710 to the p-channel current mirror.

Again, once the oscillator is running, this circuit can be disabled in favor of an amplitude detection circuit, such as the amplitude detection circuit shown in FIG. 5, or other detection circuits consistent with embodiments of the present invention. This circuit can be disabled in favor of a digital amplitude detection circuit when the crystal oscillator signals are of sufficient amplitude to properly clock the accumulator circuit. Hysteresis can also be used to avoid a condition where this circuit toggles between its on and off states.

The transistors in the above examples are shown as MOS transistors. In other embodiments of the present invention, the devices may be bipolar, HBTs, MESFETS, HFETs, or other types of devices. The capacitors shown may be metal-to-metal capacitors, thin-oxide capacitors, or any other appropriate capacitors, such as the gate of a MOS device. The resistors may be polysilicon resistors, base resistors, implant resistors, or other appropriate type of resistor. The crystals may be crystals operating in parallel or series resonance modes. Alternately, they may be other resonance devices.

Figure 8B:
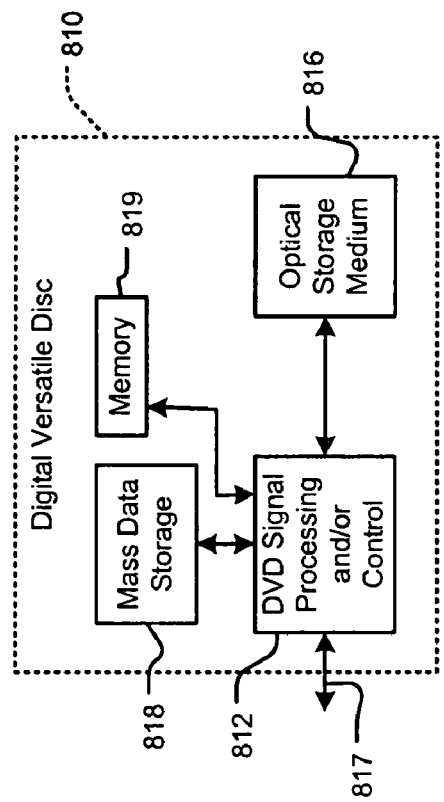
FIGS. 8A-8H illustrate various implementations of exemplary embodiments of the present invention.
Figure 8A:
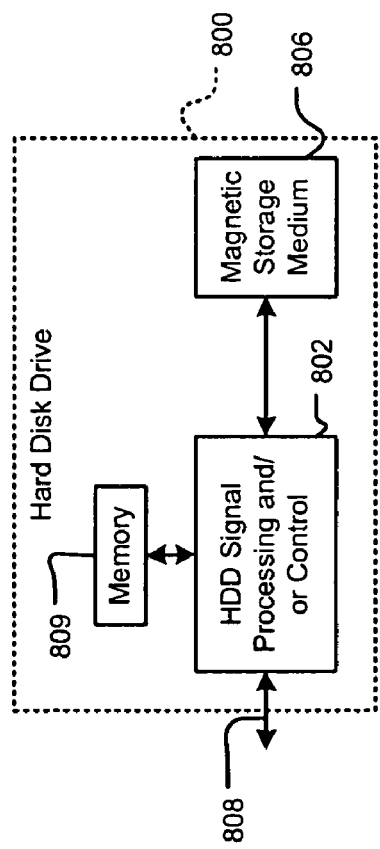

Referring now to FIGS. 8A-10G, various exemplary implementations of the present invention are shown. Referring to FIG. 8A, the present invention may be embodied in a hard disk drive 800. The present invention may implement either or both signal processing and/or control circuits, which are generally identified in FIG. 8A at 802. In some implementations, signal processing and/or control circuit 802 and/or other circuits (not shown) in HDD 800 may process data, perform coding and/or encryption, perform calculations, and/or format data that is output to and/or received from a magnetic storage medium 806.

HDD 800 may communicate with a host device (not shown) such as a computer, mobile computing devices such as personal digital assistants, cellular phones, media or MP3 players and the like, and/or other devices via one or more wired or wireless communication links 808. HDD 800 may be connected to memory 809, such as random access memory (RAM), a low latency nonvolatile memory such as flash memory, read only memory (ROM) and/or other suitable electronic data storage.

Referring now to FIG. 8B, the present invention may be embodied in a digital versatile disc (DVD) drive 810. The present invention may implement either or both signal processing and/or control circuits, which are generally identified in FIG. 8B at 812, and/or mass data storage 818 of DVD drive 810. Signal processing and/or control circuit 812 and/or other circuits (not shown) in DVD 810 may process data, perform coding and/or encryption, perform calculations, and/or format data that is read from and/or data written to an optical storage medium 816. In some implementations, signal processing and/or control circuit 812 and/or other circuits (not shown) in DVD 810 can also perform other functions such as encoding and/or decoding and/or any other signal processing functions associated with a DVD drive.

DVD drive 810 may communicate with an output device (not shown) such as a computer, television or other device via one or more wired or wireless communication links 817. DVD 810 may communicate with mass data storage 818 that stores data in a nonvolatile manner. Mass data storage 818 may include a hard disk drive (HDD) such as that shown in FIG. 8A. The HDD may be a mini HDD that includes one or more platters having a diameter that is smaller than approximately 1.8". DVD 810 may be connected to memory 819, such as RAM, ROM, low latency nonvolatile memory such as flash memory, and/or other suitable electronic data storage.

Figure 8D:
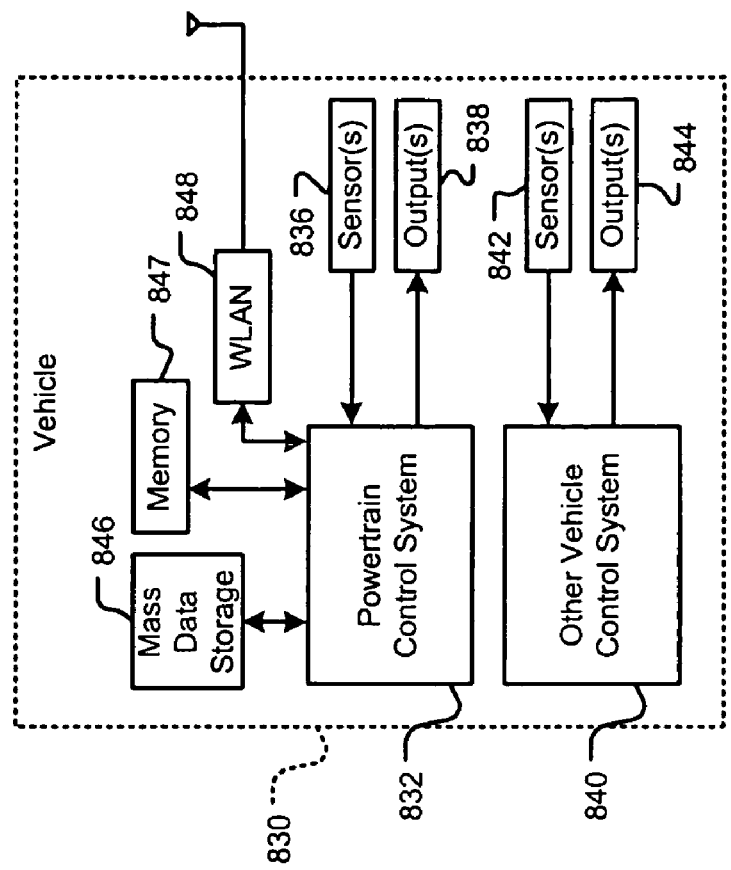
Figure 8C:
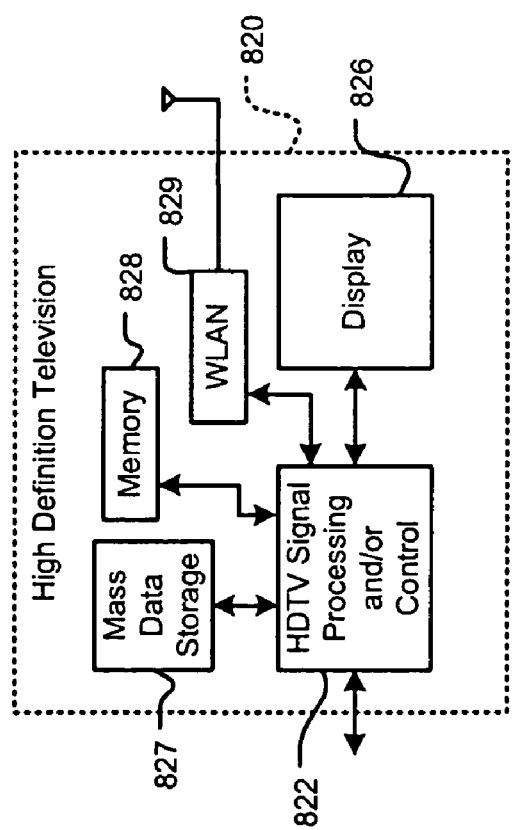

Referring now to FIG. 8C, the present invention may be embodied in a high definition television (HDTV) 820. The present invention may implement either or both signal processing and/or control circuits, which are generally identified in FIG. 8C at 822, a WLAN interface and/or mass data storage of the HDTV 820. HDTV 820 receives HDTV input signals in either a wired or wireless format and generates HDTV output signals for a display 826. In some implementations, signal processing circuit and/or control circuit 822 and/or other circuits (not shown) of HDTV 820 may process data, perform coding and/or encryption, perform calculations, format data and/or perform any other type of HDTV processing that may be required.

HDTV 820 may communicate with mass data storage 827 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". HDTV 820 may be connected to memory 828 such as RAM, ROM, low latency nonvolatile memory such as flash memory and/or other suitable electronic data storage. HDTV 820 also may support connections with a WLAN via a WLAN network interface 829.

Referring now to FIG. 8D, the present invention implements a control system of a vehicle 830, a WLAN interface and/or mass data storage of the vehicle control system. In some implementations, the present invention implements a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 840 of vehicle 830. Control system 840 may likewise receive signals from input sensors 842 and/or output control signals to one or more output devices 844. In some implementations, control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 832 may communicate with mass data storage 846 that stores data in a nonvolatile manner. Mass data storage 846 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Powertrain control system 832 may be connected to memory 847 such as RAM, ROM, low latency nonvolatile memory such as flash memory and/or other suitable electronic data storage. Powertrain control system 832 also may support connections with a WLAN via a WLAN network interface 848. The control system 840 may also include mass data storage, memory and/or a WLAN interface (all not shown).

Figure 8E:
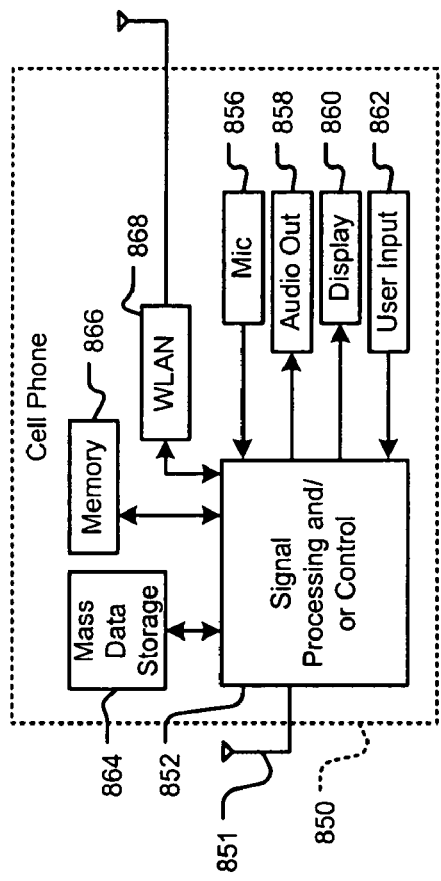

Referring now to FIG. 8E, the present invention may be embodied in a cellular phone 850 that may include a cellular antenna 851. The present invention may implement either or both signal processing and/or control circuits, which are generally identified in FIG. 8E at 852, a WLAN interface and/or mass data storage of the cellular phone 850. In some implementations, cellular phone 850 includes a microphone 856, an audio output 858 such as a speaker and/or audio output jack, a display 860 and/or an input device 862 such as a keypad, pointing device, voice actuation and/or other input device. Signal processing and/or control circuits 852 and/or other circuits (not shown) in cellular phone 850 may process data, perform coding and/or encryption, perform calculations, format data and/or perform other cellular phone functions.

Cellular phone 850 may communicate with mass data storage 864 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Cellular phone 850 may be connected to memory 866 such as RAM, ROM, low latency nonvolatile memory such as flash memory and/or other suitable electronic data storage. Cellular phone 850 also may support connections with a WLAN via a WLAN network interface 868.

Figure 8F:
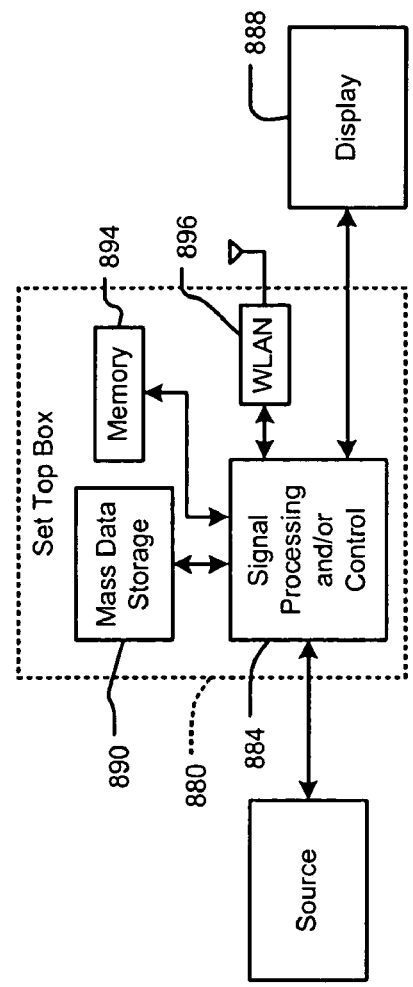

Referring now to FIG. 8F, the present invention may be embodied in a set top box 880. The present invention may implement either or both signal processing and/or control circuits, which are generally identified in FIG. 8F at 884, a WLAN interface and/or mass data storage of the set top box 880. Set top box 880 receives signals from a source such as a broadband source and outputs standard and/or high definition audio/video signals suitable for a display 888 such as a television and/or monitor and/or other video and/or audio output devices. Signal processing and/or control circuits 884 and/or other circuits (not shown) of the set top box 880 may process data, perform coding and/or encryption, perform calculations, format data and/or perform any other set top box function.

Set top box 880 may communicate with mass data storage 890 that stores data in a nonvolatile manner. Mass data storage 890 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Set top box 880 may be connected to memory 894 such as RAM, ROM, low latency nonvolatile memory such as flash memory and/or other suitable electronic data storage. Set top box 880 also may support connections with a WLAN via a WLAN network interface 896.

Figure 8G:
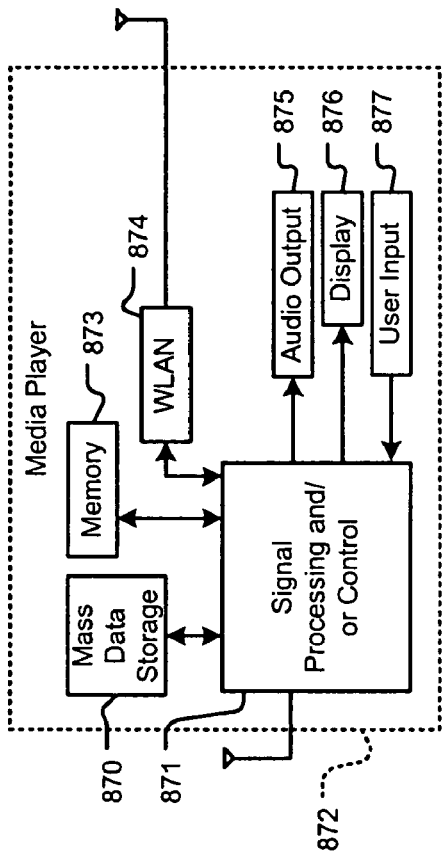

Referring now to FIG. 8G, the present invention may be embodied in a media player 872. The present invention may implement either or both signal processing and/or control circuits, which are generally identified in FIG. 8G at 871, a WLAN interface and/or mass data storage of the media player 872. In some implementations, media player 872 includes a display 876 and/or a user input 877 such as a keypad, touchpad and the like. In some implementations, media player 872 may employ a graphical user interface (GUI) that typically employs menus, drop down menus, icons and/or a point-and-click interface via display 876 and/or user input 877. Media player 872 further includes an audio output 875 such as a speaker and/or audio output jack. Signal processing and/or control circuits 871 and/or other circuits (not shown) of media player 872 may process data, perform coding and/or encryption, perform calculations, format data and/or perform any other media player function.

Media player 872 may communicate with mass data storage 870 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". Media player 872 may be connected to memory 873 such as RAM, ROM, low latency nonvolatile memory such as flash memory and/or other suitable electronic data storage. Media player 872 also may support connections with a WLAN via a WLAN network interface 874.

Figure 8H:
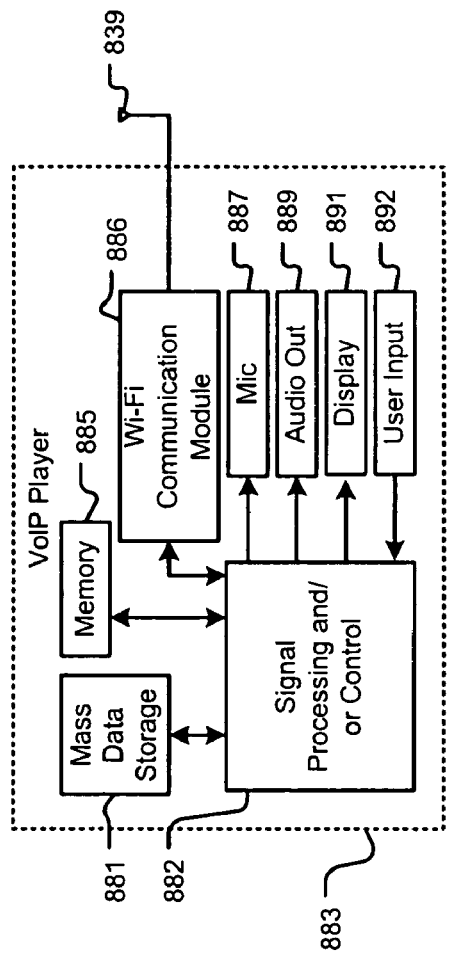

Referring to FIG. 8H, the present invention may be embodied in a Voice over Internet Protocol (VoIP) phone 883 that may include an antenna 839. The present invention may implement either or both signal processing and/or control circuits, which are generally identified in FIG. 8H at 882, a wireless interface and/or mass data storage of the VoIP phone 883. In some implementations, VoIP phone 883 includes, in part, a microphone 887, an audio output 889 such as a speaker and/or audio output jack, a display monitor 891, an input device 892 such as a keypad, pointing device, voice actuation and/or other input devices, and a Wireless Fidelity (Wi-Fi) communication module 886. Signal processing and/or control circuits 882 and/or other circuits (not shown) in VoIP phone 883 may process data, perform coding and/or encryption, perform calculations, format data and/or perform other VoIP phone functions.

VoIP phone 883 may communicate with mass data storage 502 that stores data in a nonvolatile manner such as optical and/or magnetic storage devices, for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". VoIP phone 883 may be connected to memory 885, which may be a RAM, ROM, low latency nonvolatile memory such as flash memory and/or other suitable electronic data storage. VoIP phone 883 is configured to establish communications link with a VoIP network (not shown) via Wi-Fi communication module 886. Still other implementations in addition to those described above are contemplated.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:

a gain element configured to drive a crystal;

a DC control loop configured to adjust a DC level of a signal at an output of the gain element; and an amplitude control loop configured to adjust an amplitude of the signal at the output of the gain element, wherein the DC control loop comprises an amplifier in communication with the gain element, the amplifier separate from the amplitude control loop.

2. The integrated circuit of claim 1 wherein the gain element has an input responsive to a first node of the crystal and the crystal has a second node responsive to the output of the gain element.

3. The integrated circuit of claim 2 wherein the gain element is a transistor.

4. The integrated circuit of claim 3 wherein the transistor is a MOS transistor.

5. The integrated circuit of claim 1 wherein the amplifier is configured to compare a signal generated by the output of the gain element to a bias voltage and provide an output responsive to the comparison.

6. The integrated circuit of claim 5 wherein the gain element is a MOS transistor responsive to the output of the amplifier.

7. The integrated circuit of claim 6 wherein the DC level of the signal at the output of the gain element is adjusted to a voltage that is between two supply voltages received by the integrated circuit.

8. The integrated circuit of claim 1 wherein the amplitude control loop comprises an amplitude measurement circuit configured to provide a measurement of an amplitude of the signal at the input of the gain element.

9. The integrated circuit of claim 8 wherein the amplitude measurement circuit comprises a peak detect circuit.

10. The integrated circuit of claim 9 wherein the peak detect circuit comprises a diode and a capacitance.

11. An integrated circuit comprising:
a gain element configured to drive a crystal;
a DC control loop configured to adjust a DC level of a signal at an output of the gain element; and
an amplitude control loop configured to adjust an amplitude of the signal at the output of the gain element,
wherein the amplitude control loop comprises an amplitude measurement circuit configured to provide a measurement of an amplitude of the signal at the input of the gain element and a comparator configured to compare the measurement of the amplitude of the signal at the input of the gain element with a high threshold and a low threshold, the comparator further configured to provide one or more signals in response to the comparisons.

12. The integrated circuit of claim 11 wherein the amplitude control loop further comprises a counter configured to increment, decrement, or maintain an output value in response to the one or more signals provided by the comparator.

13. The integrated circuit of claim 12 wherein the amplitude control loop further comprises a digital-to-analog converter configured to convert the output of the counter to a current.

14. The integrated circuit of claim 13 wherein the current is provided to the gain element.

15. The integrated circuit of claim 1 wherein the DC level of a signal generated by the output of the gain element is used to set a DC level of a signal at an input of the gain element.

16. The integrated circuit of claim 15 wherein the DC level of the signal at the output of the gain element is DC coupled to the input of the gain element using at least one resistor.

17. A method of generating a first oscillator signal comprising:
driving a resonant element to generate a first oscillator signal;
adjusting a DC level of the first oscillator signal; and
adjusting an amplitude of the first oscillator signal,
wherein adjusting the DC level comprises using an amplifier separate from a control loop for adjusting the amplitude of the first oscillator signal.

18. The method of claim 17 wherein the driving the resonant element is performed by providing a drive signal to the resonant element, and wherein the drive signal is responsive to the resonant element.

19. The method of claim 18 further comprising providing the drive signal with a gain circuit.

20. The method of claim 19 wherein the gain circuit is a MOS transistor.

21. The method of claim 17 further comprising:
adjusting the DC level of the first oscillator signal by:
comparing the first oscillator signal with a bias voltage; and
providing an output responsive to the comparison.

22. The method of claim 21 wherein the gain element is a MOS transistor responsive to the output of the amplifier.

23. The method of claim 22 further comprising adjusting the DC level of the first oscillator signal to be between two supply voltages received by the integrated circuit.

24. The method of claim 17 further comprising:
measuring an amplitude of a second oscillator signal; and
providing a measurement of the amplitude of the second oscillator signal.

25. The method of claim 24 further comprising measuring the amplitude of the second oscillator signal using a peak detector.

26. The method of claim 25 wherein the amplitude of the second oscillator signal is measured using a diode and a capacitance.

27. A method of generating a first oscillator signal comprising:
driving a resonant element to generate a first oscillator signal;
adjusting a DC level of the first oscillator signal; and
adjusting an amplitude of the first oscillator signal by:
measuring an amplitude of a second oscillator signal;
providing a measurement of the amplitude of the second oscillator signal;
comparing the measurement of the amplitude of the second oscillator signal with a high threshold and a low threshold; and
providing one or more signals in response to the comparison.

28. The method of claim 27 further comprising:
decrementing an output value when the amplitude of the second oscillator signal is greater than the high threshold;
maintaining the output value when the amplitude of the second oscillator signal is less than the high threshold and greater than the low threshold; and
incrementing the output value when the amplitude of the second oscillator signal is less than the low threshold.

29. The method of claim 28 further comprising generating a bias current in response to the output value.

30. The method of claim 29 further comprising providing the bias current to a gain circuit, the gain circuit providing the drive to the resonant element.

31. The method of claim 17 further comprising setting the DC level of the second oscillator signal using the DC level of the first oscillator signal.

32. The method of claim 31 further comprising DC coupling the DC level of the first oscillator signal to generate the DC level of the second oscillator signal.

33. An integrated circuit comprising:
a gain element configured to drive a resonant element;
a DC control loop configured to adjust a DC level of a signal at an output of the gain element; and
an amplitude control loop configured to adjust an amplitude of the signal at the output of the gain element,
wherein the DC control loop comprises an amplifier in communication with the gain element, the amplifier separate from the amplitude control loop.

34. The integrated circuit of claim 33 wherein the resonant element is included on the integrated circuit.

* * * * *